United States Patent
Hagihara (10) Patent No.: US 9,462,204 B2
(45) Date of Patent: Oct. 4, 2016

(54) ANALOG TO DIGITAL CONVERTER FOR IMAGING DEVICE

(71) Applicant: OLYMPUS CORPORATION, Tokyo (JP)

(72) Inventor: Yoshio Hagihara, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/817,821

(22) Filed: Aug. 4, 2015

(65) Prior Publication Data

US 2015/0341583 A1    Nov. 26, 2015

Related U.S. Application Data

(63) Continuation of application No. PCT/JP2014/076992, filed on Oct. 8, 2014.

(30) Foreign Application Priority Data

Dec. 13, 2013  (JP) ................ 2013-258287

(51) Int. Cl.
*H04N 5/3745* (2011.01)
*H03M 1/08* (2006.01)
(Continued)

(52) U.S. Cl.
CPC ............ *H04N 5/3745* (2013.01); *H03M 1/08* (2013.01); *H04N 5/363* (2013.01); *H04N 5/378* (2013.01);
(Continued)

(58) Field of Classification Search
CPC ........... H04N 5/3745; H04N 5/37455; H04N 5/378; H04N 5/363; H04N 5/3765; H04N 5/63; H03M 1/12
See application file for complete search history.

(56) References Cited

U.S. PATENT DOCUMENTS

| 2006/0001750 A1* | 1/2006 | Mizuguchi | H04N 5/335 348/294 |
| 2013/0215303 A1 | 8/2013 | Ueno | |
| 2013/0234004 A1* | 9/2013 | Hagihara | H04N 5/378 250/208.1 |

FOREIGN PATENT DOCUMENTS

| JP | 2006-340044 A | 12/2006 |
| JP | 2010-93641 A | 4/2010 |

(Continued)

OTHER PUBLICATIONS

International Search Report dated Dec. 22, 2014, issued in counterpart application No. PCT/JP2014/076992 (2 pages).

(Continued)

*Primary Examiner* — Nelson D. Hernández Hernández
(74) *Attorney, Agent, or Firm* — Westerman, Hattori, Daniels & Adrian, LLP (57) ABSTRACT

An imaging device includes: an imaging section in which a plurality of unit pixels having a photoelectric conversion element are arranged in the form of a matrix; a reference signal generating section configured to generate a reference signal that increases or decreases with a passage of time; a comparison section that includes a differential amplifier including a first input terminal electrically connected to the reference signal generating section and a second input terminal electrically connected to the unit pixels and configured to compare voltages of the first input terminal and the second input terminal and is arranged for each column or for a plurality of columns of a pixel array of the imaging section; and a measurement section configured to measure a comparison time from when the comparison section starts comparison until the comparison ends and generate data corresponding to the comparison time.

6 Claims, 4 Drawing Sheets

(51) Int. Cl.
| | |
|---|---|
| *H04N 5/376* | (2011.01) |
| *H04N 5/63* | (2006.01) |
| *H04N 5/363* | (2011.01) |
| *H04N 5/378* | (2011.01) |
| *H03M 1/12* | (2006.01) |
| *H03M 1/56* | (2006.01) |

(52) U.S. Cl.
CPC ........ *H04N 5/3765* (2013.01); *H04N 5/37455* (2013.01); *H04N 5/63* (2013.01); *H03M 1/123* (2013.01); *H03M 1/56* (2013.01)

(56) References Cited

FOREIGN PATENT DOCUMENTS

| | | |
|---|---|---|
| JP | 2010-109888 A | 5/2010 |
| JP | 2013-172270 A | 9/2013 |
| JP | 2013-187744 A | 9/2013 |
| WO | 2012/143982 A1 | 10/2012 |

OTHER PUBLICATIONS

Notice of Allowance, dated Jun. 16, 2015, issued in counterpart application No. JP2013-258287 (6 pages).

* cited by examiner

|  | PRIOR ART | PRESENT EMBODIMENT |
|---|---|---|
| COEFFICIENT OF FEEDTHROUGH | $\dfrac{C_{gd}}{C_p}$ | $\dfrac{C_{gd}}{C_P+C_{LPF}}$ |
| SETTLING | $R_{DAC} \times n \times C_{DAC}$ | $R_{DAC} \times n \times (C_{LPF}+C_{DAC})$ |
| FILTERING BANDWIDTH | $\dfrac{1}{R_{DAC} \times n \times C_P}$ | $\dfrac{1}{R_{DAC} \times n \times (C_P+C_{LPF})}$ |

ANALOG TO DIGITAL CONVERTER FOR IMAGING DEVICE

CROSS REFERENCE TO RELATED APPLICATIONS

This application is a continuation application based on a PCT Patent Application No. PCT/JP2014/076992, filed Oct. 8, 2014, whose priority is claimed on Japanese Patent Application No. 2013-258287 filed on Dec. 13, 2013, the entire content of which are hereby incorporated by reference.

BACKGROUND OF THE INVENTION

1. Field of the Invention

The present invention relates to an imaging device.

2. Description of the Related Art

As imaging devices using a ramp type AD converter according to the prior art, a configuration described in Japanese Unexamined Patent Application No. 2006-340044 or Japanese Unexamined Patent Application No. 2010-93641 is known. First, a configuration and operations of the imaging device according to the prior art will be described.

Figure 4:
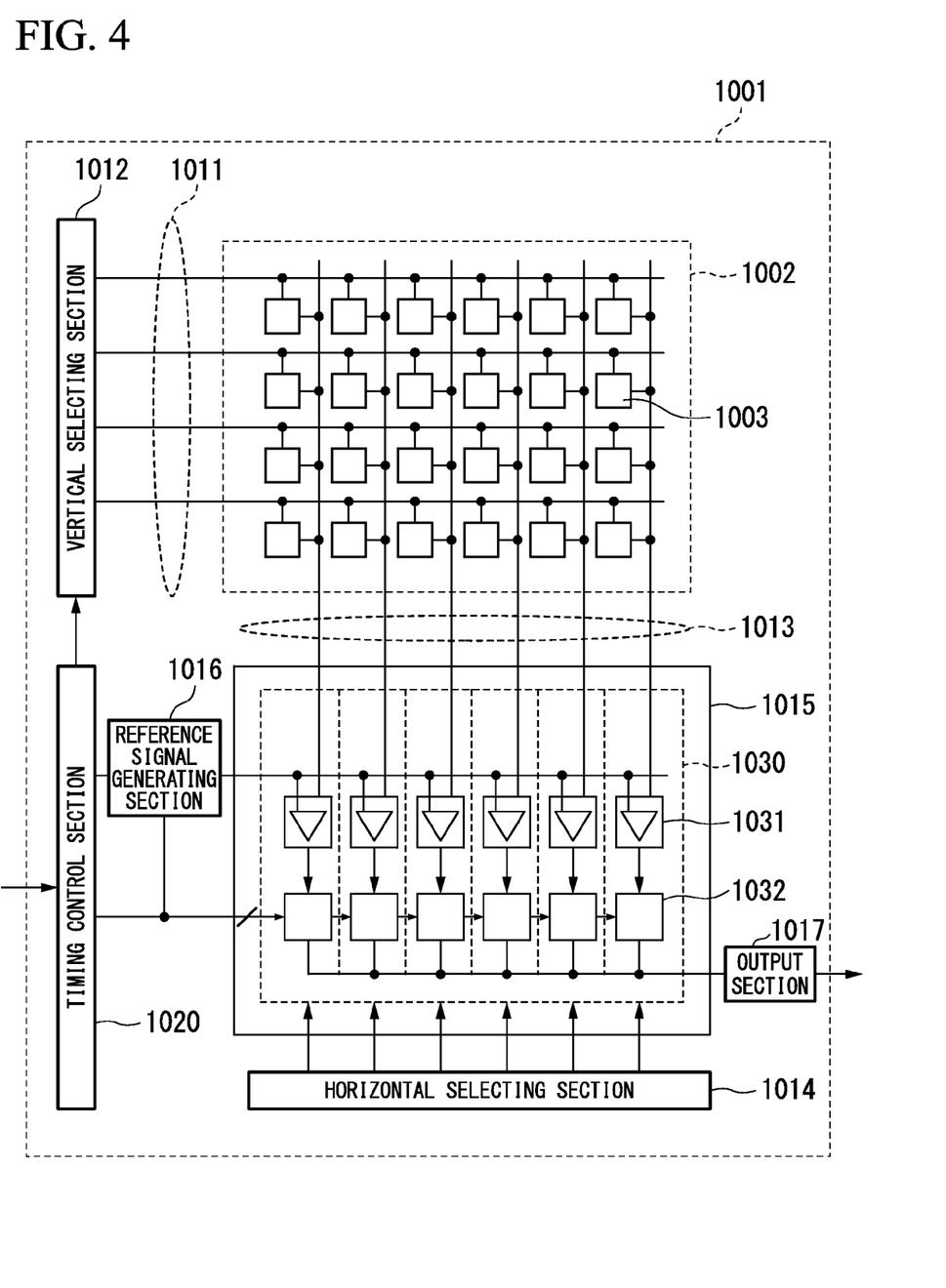
FIG. 4 is a block diagram illustrating a configuration of an imaging device according to the prior art.

FIG. 4 illustrates a schematic configuration of an imaging device using a ramp type AD converter according to the prior art. An imaging device 1001 includes an imaging section 1002, a vertical selecting section 1012, a horizontal selecting section 1014, a column processing section 1015, a reference signal generating section 1016, an output section 1017, and a timing control section 1020.

The timing control section 1020 controls sections such as the vertical selecting section 1012, the horizontal selecting section 1014, the column processing section 1015, the reference signal generating section 1016, and the output section 1017. The imaging section 1002 has a configuration in which a plurality of unit pixels 1003 having a photoelectric conversion element are arranged in the form of a matrix. The unit pixel 1003 generates a pixel signal corresponding to an amount of incident electromagnetic waves and outputs a pixel signal to a vertical signal line 1013 provided for each column.

The vertical selecting section 1012 controls a row address or row scanning of the imaging section 1002 through a row control line 1011 when each of the unit pixels 1003 of the imaging section 1002 is driven. The horizontal selecting section 1014 controls a column address or column scanning of a column AD converting section 1030 of the column processing section 1015.

The column processing section 1015 includes the column AD converting section 1030 provided for each column of the imaging section 1002. The column AD converting section 1030 converts an analog signal, which is a pixel signal output from each of the unit pixels 1003 of the imaging section 1002 to each column, into digital data and outputs the converted data. The reference signal generating section 1016 includes, for example, an integration circuit and a DAC circuit, and generates a reference signal whose level is changed in an inclined shape with the passage of time.

Next, a configuration of the column AD converting section 1030 will be described. All of the column AD converting sections 1030 are configured to be substantially the same, and each of the column AD converting sections 1030 includes a comparison section 1031 and a measurement section 1032.

The comparison section 1031 is a comparator circuit that has a generally well-known differential amplifier as a basic configuration. The comparison section 1031 compares the pixel signal output from the unit pixel 1003 of the imaging section 1002 with the reference signal. For example, when the reference signal is greater than the pixel signal, a High level is output. For example, when the reference signal is smaller than the pixel signal, a Low level is output.

The measurement section 1032 includes an up/down counter circuit, measures a comparison time from when the comparison section 1031 starts comparison until the comparison ends, and generates data corresponding to the comparison time. Accordingly, data corresponding to a size of the pixel signal is obtained. The horizontal selecting section 1014 includes a shift register or a decoder, and controls a column address or column scanning of each the column AD converting section 1030 in the column processing section 1015. Accordingly, the AD converted digital data sequentially passes through a horizontal signal line and is output to the output section 1017.

Next, an AD conversion operation will be described. A specific operation of the unit pixel 1003 will not be described, but a reset level and a signal level are output from the unit pixel 1003 as the pixel signal.

First, after the reset level read from the unit pixel 1003 is stabilized, voltages of two input terminals of the differential amplifier constituting the comparison section 1031 are reset. Then, the comparison section 1031 compares the reference signal with the reset level and ends the comparison process at a timing at which the reference signal satisfies predetermined conditions for the reset level. The measurement section 1032 performs measurement of the comparison time in a down-count mode. A measurement value when the comparison process ends becomes digital data of the reset level.

Next, when the signal level is read from the unit pixel 1003, a reset operation in the comparison section 1031 is not performed. After the signal level read from the unit pixel 1003 is stabilized, the comparison section 1031 compares the reference signal with the signal level, and ends the comparison process at a timing at which the reference signal satisfies predetermined conditions for the signal level. The measurement section 1032 performs measurement of the comparison time in an up-count mode. A measurement value when the comparison process ends becomes digital data of a signal component (a signal obtained by subtracting the reset level from the signal level).

Figure 5:
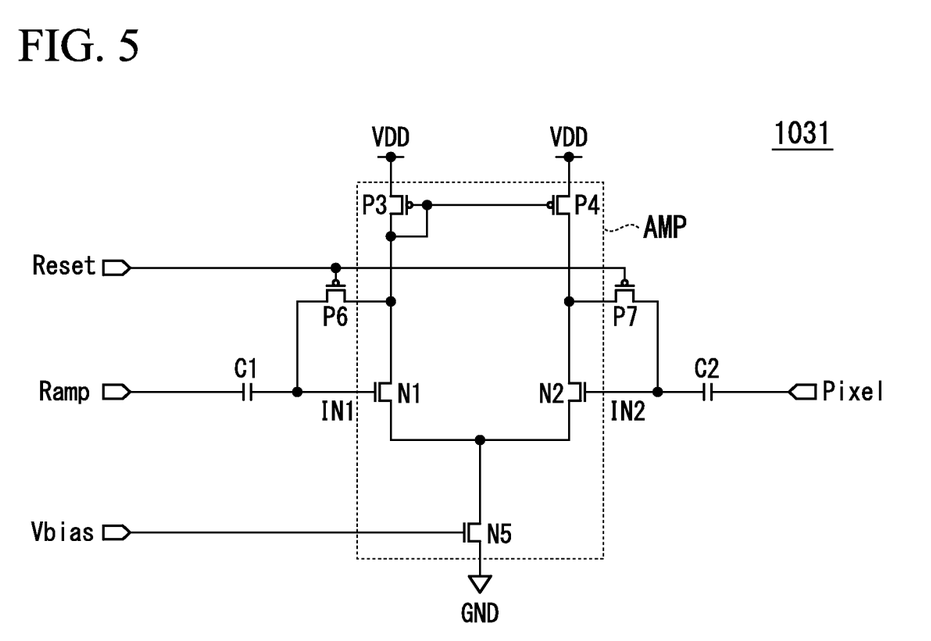
FIG. 5 is a circuit diagram illustrating a configuration of a comparison section according to the prior art.

FIG. 5 illustrates a specific circuit configuration of the comparison section 1031 according to the prior art. The comparison section 1031 includes a differential amplifier AMP, capacitive elements C1 and C2, and transistors P6 and P7.

The differential amplifier AMP includes transistors N1 and N2 composed of an NMOS to which a source is commonly connected, transistors P3 and P4 composed of a PMOS that is connected between drains of the transistors N1 and N2 and power VDD and to which a gate is commonly connected, and a current source N5 of an NMOS that is connected between a node commonly connected to sources of the transistors N1 and N2 and a ground GND.

The transistors P6 and P7 composed of a PMOS are connected between gates and drains of the transistors N1 and N2. The transistors P6 and P7 serve as a reset section configured to set an ON state when a reset pulse Reset of Low active is supplied from the timing control section 1020 to each gate, connect gates and drains of the transistors N1 and N2, and reset voltages of gates of the transistors N1 and N2, that is, voltages of two input terminals (a first input terminal IN1 and a second input terminal IN2) of the differential amplifier.

First terminals of the capacitive elements C1 and C2 for cutting a DC level are connected to gates of the transistors N1 and N2, respectively. A second terminal of the capacitive element C1 is supplied with a reference signal Ramp from the reference signal generating section 1016. The second terminal of the capacitive element C2 is supplied with a pixel signal Pixel output from each of the unit pixels 1003 of the imaging section 1002. In addition, a gate of the current source N5 is supplied with a bias voltage Vbias for controlling a current value.

When a plurality of ramp type AD converters represented by a column parallel ramp type AD converter of a CMOS image sensor are configured, the plurality of AD converters share the reference signal. Therefore, when the reference signal is changed due to an influence from a comparison circuit (the comparison section 1031 of FIG. 4) according to an operation of a certain AD converter, other AD converters receive the influence and errors occur in an AD conversion result.

Figure 6:
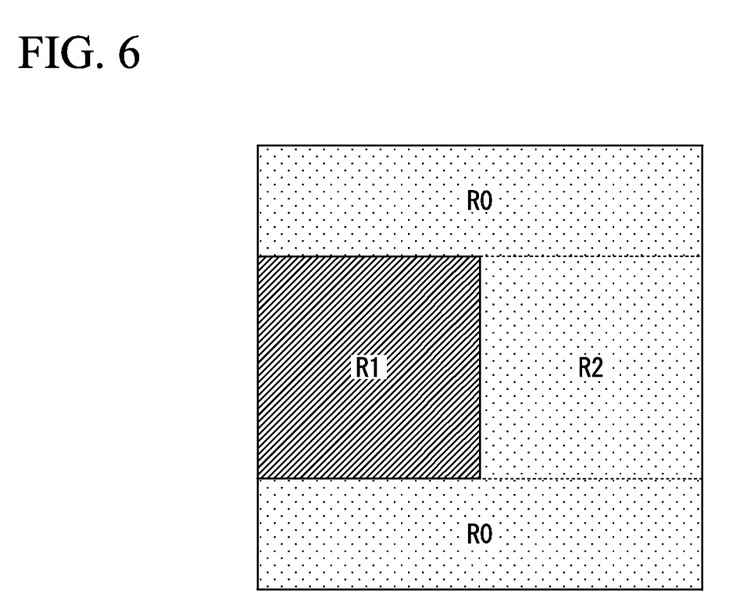
FIG. 6 is a reference diagram illustrating an image captured by a CMOS image sensor according to the prior art.

FIG. 6 schematically illustrates an example of an image captured by a CMOS image sensor. The image illustrated in FIG. 6 illustrates an example in which bright regions (regions R0 and R2) and a dark region (a region R1) are mixed. In this example, a signal indicating a comparison result in a comparison circuit is inverted earlier in the region R1 than in the region R2. When the signal indicating the comparison result of the region R1 is inverted earlier, the reference signal is changed due to feedthrough (kickback) from the comparison circuit of the region R1, and errors occur in an AD conversion result of a column of the bright region (the region R2, and particularly, a portion adjacent to the region R1). As a result, image quality is degraded.

As a method of addressing this influence, the following methods are considered.

I) A method in which a buffer circuit represented by a source follower circuit is added to an input of each comparison circuit.

II) A method in which an output impedance of a reference signal generating section (a DAC circuit thereof) is decreased.

In the method I), when the buffer circuit is added to the input of each comparison circuit, an error factor transmitted from the comparison circuit to the reference signal is reduced due to an isolation capability of the buffer circuit.

In the method II), a resistance value of the DAC circuit decreases. As a result, a current value of a current source necessary for generating the same reference signal (for example, a reference voltage of 1 [V]) increases. Therefore, a consumption current increases.

SUMMARY

An imaging device may include: an imaging section in which a plurality of unit pixels having a photoelectric conversion element are arranged in the form of a matrix; a reference signal generating section configured to generate a reference signal that increases or decreases with a passage of time; a comparison section that includes a differential amplifier including a first input terminal electrically connected to the reference signal generating section and a second input terminal electrically connected to the unit pixels and configured to compare voltages of the first input terminal and the second input terminal and is arranged for each column or for a plurality of columns of a pixel array of the imaging section; and a measurement section configured to measure a comparison time from when the comparison section starts comparison until the comparison ends and generate data corresponding to the comparison time. The comparison section may include a first capacitive element and a second capacitive element. A first terminal of the first capacitive element may be electrically connected to a second terminal of the second capacitive element and the reference signal generating section. A second terminal of the first capacitive element may be electrically connected to a predetermined voltage source. A first terminal of the second capacitive element may be electrically connected to the first input terminal.

The first capacitive element may have a capacitance value that is smaller than a capacitance value of the second capacitive element.

The predetermined voltage source may be either power or a ground.

DETAILED DESCRIPTION OF THE PREFERRED EMBODIMENTS

Figure 1:
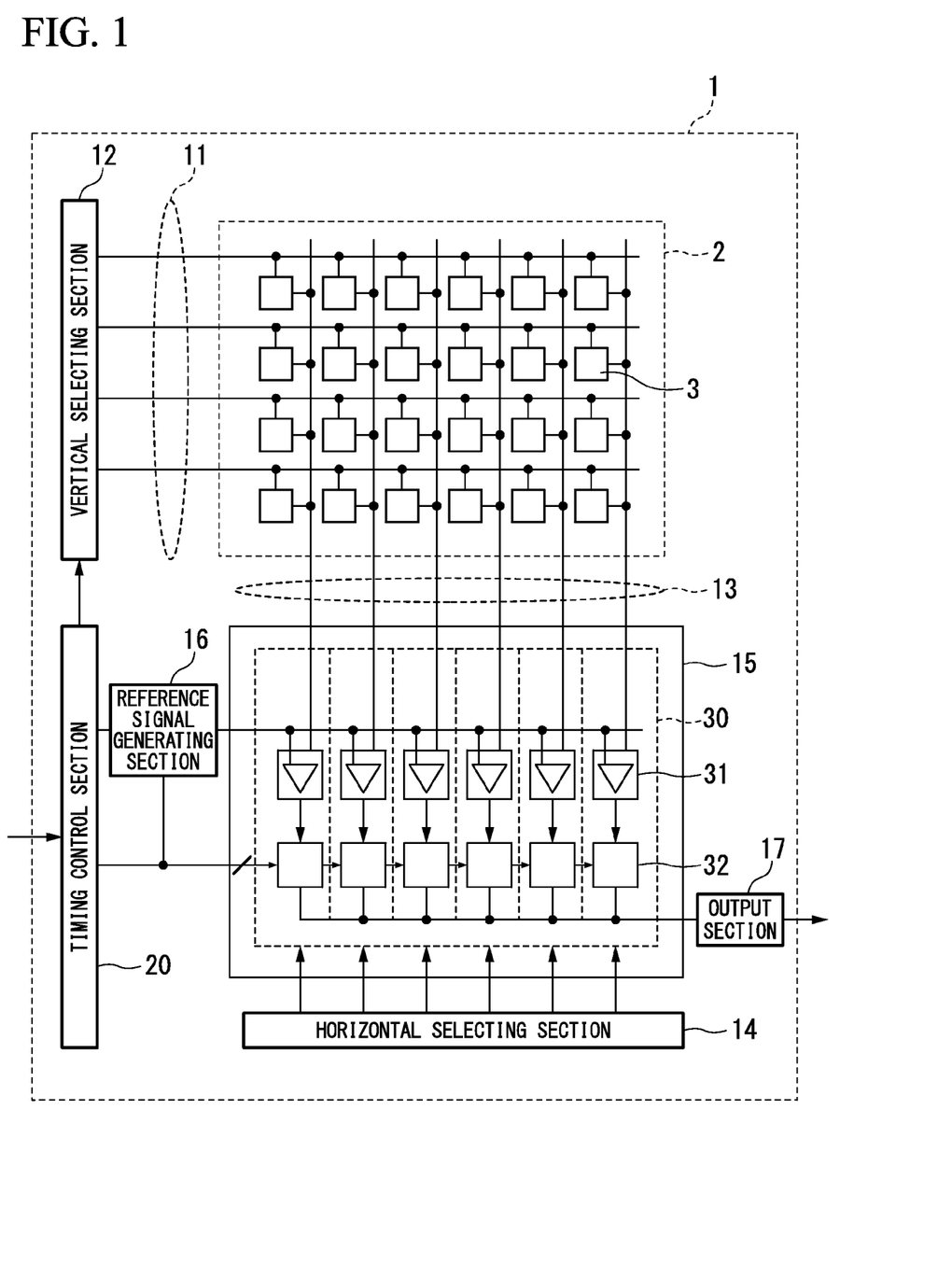
FIG. 1 is a block diagram illustrating a configuration of an imaging device according to an embodiment of the present invention.

Hereinafter, an embodiment of the present invention will be described with reference to the drawings. FIG. 1 illustrates an exemplary configuration of an imaging device according to the present embodiment. An imaging device 1 illustrated in FIG. 1 includes an imaging section 2, a vertical selecting section 12, a horizontal selecting section 14, a column processing section 15, a reference signal generating section 16, an output section 17, and a timing control section 20.

The imaging section 2 has a configuration in which a plurality of unit pixels 3 having a photoelectric conversion element are arranged in the form of a matrix. The unit pixel 3 generates a pixel signal corresponding to an amount of incident electromagnetic waves, and outputs the pixel signal to a vertical signal line 13 provided for each column. The vertical selecting section 12 selects each row of the imaging section 2. The reference signal generating section 16 generates a reference signal (a ramp wave) that increases or decreases with the passage of time. The column processing section 15 includes a column AD converting section 30 configured to perform AD conversion on the pixel signal output from the unit pixel 3. The horizontal selecting section 14 reads AD converted digital data through the horizontal signal line. The output section 17 outputs digital data read by the horizontal selecting section 14 to a circuit in the subsequent stage. The timing control section 20 controls the sections.

While the imaging section 2 composed of the unit pixels 3 of 4 rows and 6 columns is described in FIG. 1 for simplicity, the number of rows and the number of columns of an array of the unit pixel 3 may be any natural number of 2 or more. Actually, several tens to several tens of thousands of unit pixels 3 are arranged in rows and columns of the imaging section 2. Although not illustrated, the unit pixel 3 of the imaging section 2 includes a photoelectric conversion element such as a photodiode, a photogate or a phototransistor, and a transistor circuit.

Hereinafter, the sections will be described in further detail. In the imaging section 2, the unit pixels 3 are two-dimensionally arranged in 4 rows and 6 columns. In addition, a row control line 11 is wired for each row of this pixel array of 4 rows and 6 columns. Each end of the row control line 11 is connected to an output end corresponding to a row of the vertical selecting section 12. The vertical selecting section 12 includes a shift register or a decoder, and controls a row address or row scanning of the imaging section 2 through the row control line 11 when each of the unit pixels 3 of the imaging section 2 is driven. In addition, the vertical signal line 13 is wired for each column of a pixel array of the imaging section 2.

The column processing section 15 includes the column AD converting section 30 provided, for example, for each column of the pixel array of the imaging section 2, that is, for each vertical signal line 13. The column AD converting section 30 converts an analog pixel signal read from each of the unit pixels 3 of the imaging section 2 to each column through the vertical signal line 13 into digital data. In this example, the column AD converting section 30 is arranged in one-to-one correspondence with one column of the pixel array of the imaging section 2. However, this is only an example, and arrangement is not limited to this arrangement relation. For example, a configuration in which one column AD converting section 30 is arranged with respect to the plurality of columns of the pixel array of the imaging section 2 and the one column AD converting section 30 is used among the plurality of columns in a time divisional manner may be used. The column processing section 15 constitutes an analog-digital conversion section (an AD conversion circuit) configured to convert an analog pixel signal read from the unit pixel 3 of a selected row of the imaging section 2 into digital pixel data together with the reference signal generating section 16 to be described below.

The reference signal generating section 16 includes, for example, an integration circuit, generates a reference signal, that is, a ramp wave whose level is changed in an inclined shape with the passage of time according to control by the timing control section 20, and supplies the reference signal to the column AD converting section 30 through a reference signal line. The reference signal generating section 16 is not limited to a section using the integration circuit, but a section using the DAC circuit may be used. However, when a configuration in which the DAC circuit is used to digitally generate a ramp wave is used, it is necessary to set a step of the ramp wave to be smaller, or to have a configuration similar thereto.

The horizontal selecting section 14 includes a shift register or a decoder, and controls a column address or column scanning of the column AD converting section 30 of the column processing section 15. According to the control by the horizontal selecting section 14, digital data that is AD converted by the column AD converting section 30 sequentially passes through the horizontal signal line and is read by the output section 17.

The timing control section 20 includes a function block of TG (=Timing Generator) supplying a pulse signal of a predetermined timing or a clock necessary for operations of respective sections such as the vertical selecting section 12, the reference signal generating section 16, the horizontal selecting section 14, the column processing section 15, and the output section 17 and a function block for communicating with the TG.

The output section 17 outputs binary-coded digital data. In addition, the output section 17 may have signal processing functions therein, for example, black level adjustment, column variation correction, and color processing in addition to a buffering function. Furthermore, the output section 17 may convert n-bit parallel digital data into serial data and output the converted data.

Within the configuration in the imaging device 1, the vertical selecting section 12, the horizontal selecting section 14, the output section 17, and the timing control section 20 are not a characteristic configuration of a ramp type AD converter. In addition, such a configuration is not an essential configuration in order to obtain characteristic effects of the imaging device 1 according to the present embodiment.

Next, a configuration of the column AD converting section 30 will be described. Each column AD converting section 30 compares an analog pixel signal read from each of unit pixels 3 of the imaging section 2 through the vertical signal line 13 with a reference signal that is supplied from the reference signal generating section 16 for AD conversion, and thus generates a pulse signal having a size (a pulse width) in a time axis direction corresponding to a size of the pixel signal. Therefore, the column AD converting section 30 sets data corresponding to a duration of the pulse width of the pulse signal as digital data corresponding to a size of the pixel signal for AD conversion.

Hereinafter, a configuration of the column AD converting section 30 will be described in detail. The column AD converting section 30 is arranged for each column of the pixel array of the imaging section 2. In FIG. 1, the six column AD converting sections 30 are arranged. The column AD converting sections 30 of respective columns are configured to be the same. The column AD converting section 30 includes a comparison section 31 and a measurement section 32. In this example, the comparison section 31 and the measurement section 32 are arranged for each column of the pixel array of the imaging section 2. However, the comparison section 31 and the measurement section 32 may be arranged for a plurality of columns of the pixel array of the imaging section 2.

The comparison section 31 compares a signal voltage corresponding to an analog pixel signal output from the unit pixel 3 of the imaging section 2 through the vertical signal line 13 with a ramp voltage of the reference signal supplied from the reference signal generating section 16, and thus converts a size of the pixel signal into information (a pulse width of the pulse signal) in a time axis direction. The comparison output of the comparison section 31 becomes, for example, a High level (H level) when the ramp voltage is greater than the signal voltage, or a Low level (L level) when the ramp voltage is equal to or less than the signal voltage. The comparison section 31 ends the comparison process at a timing at which the reference signal satisfies predetermined conditions for the pixel signal (in this example, a timing at which voltages of the reference signal and the pixel signal are substantially the same). At a timing at which the comparison section 31 ends the comparison process, the comparison output of the comparison section 31 is inverted.

The measurement section 32 includes, for example, an up/down counter circuit of n bits that measures a comparison time from when the comparison section 31 starts comparison until the comparison ends and generates data corresponding to the comparison time. The n bits are, for example, 10 bits. A case in which the n bits are 10 bits is only an example. The n bits may be fewer than 10 bits (for example, 8 bits) or may be more than 10 bits (for example, 12 bits). In addition, a circuit constituting the measurement section 32 is not necessarily limited to the up/down counter circuit.

Next, an operation of this example will be described. Here, a specific operation of the unit pixel 3 will not be described, and the reset level and the signal level are output from the unit pixel 3 as is well known.

The AD conversion is performed as follows. For example, a voltage of the reference signal that is lowered at a predetermined gradient is compared with a voltage of the reset level that is the pixel signal from the unit pixel 3 or the signal level. A duration from when the reference signal used in the comparison process is generated until the signal voltage corresponding to the reset level or the signal level matches the ramp voltage of the reference signal is measured using, for example, a reference clock, and thus digital data corresponding to a size of the reset level or the signal level is obtained.

Here, the reset level including noise of the pixel signal is read by a first read operation from each of the unit pixels 3 of the selected row of the imaging section 2 as the analog pixel signal. Then, the signal level is read by a second read operation. Also, the reset level and the signal level are input to the column AD converting section 30 through the vertical signal line 13 in time series.

First Reading

After the pixel signal (the reset level) output from the unit pixel 3 of any row of the pixel array of the imaging section 2 to the vertical signal line 13 is stabilized, a reset operation of the comparison section 31 is performed. Then, the timing control section 20 supplies control data of reference signal generation to the reference signal generating section 16. The reference signal generating section 16 that has received the data outputs the reference signal whose entire waveform is temporally changed in a ramp shape as a comparison voltage supplied to a first input terminal of the comparison section 31. The comparison section 31 compares a voltage of the first input terminal to which the reference signal is supplied from the reference signal generating section 16 with a voltage of a second input terminal to which the reset level is supplied, and inverts the comparison output when the voltages are substantially the same.

The measurement section 32 starts measurement in a down-count mode based on comparison start of the comparison section 31, and maintains a measurement value when the comparison output of the comparison section 31 is inverted. That is, the measurement section 32 maintains digital data corresponding to the reset level. When a predetermined duration elapses, the timing control section 20 stops supply of the control data to the reference signal generating section 16 and output of the reference clock. Accordingly, the reference signal generating section 16 stops generation of the reference signal.

Second Reading

Next, when second reading is performed, the signal level corresponding to an amount of incident light for each unit pixel 3 is read. When the second reading is performed, the reset operation of the comparison section 31 is not performed.

After the pixel signal (the signal level) output from the unit pixel 3 of any row of the pixel array of the imaging section 2 to the vertical signal line 13 is stabilized, the timing control section 20 supplies control data of reference signal generation to the reference signal generating section 16. The reference signal generating section 16 that has received the data outputs the reference signal. The comparison section 31 compares a voltage of the first input terminal to which the reference signal is supplied from the reference signal generating section 16 with a voltage of the second input terminal to which the signal level is supplied, and inverts the comparison output when the voltages are substantially the same.

The measurement section 32 starts measurement in an up-count mode based on comparison start of the comparison section 31 and maintains a measurement value when the comparison output of the comparison section 31 is inverted. That is, the measurement section 32 maintains digital data corresponding to a signal component obtained by subtracting the reset level from the signal level (=correlated double sampling (CDS) process). When the predetermined duration elapses, the timing control section 20 stops supply of the control data to the reference signal generating section 16 and output of the reference clock. Accordingly, the reference signal generating section 16 stops generation of the reference signal.

Figure 2:
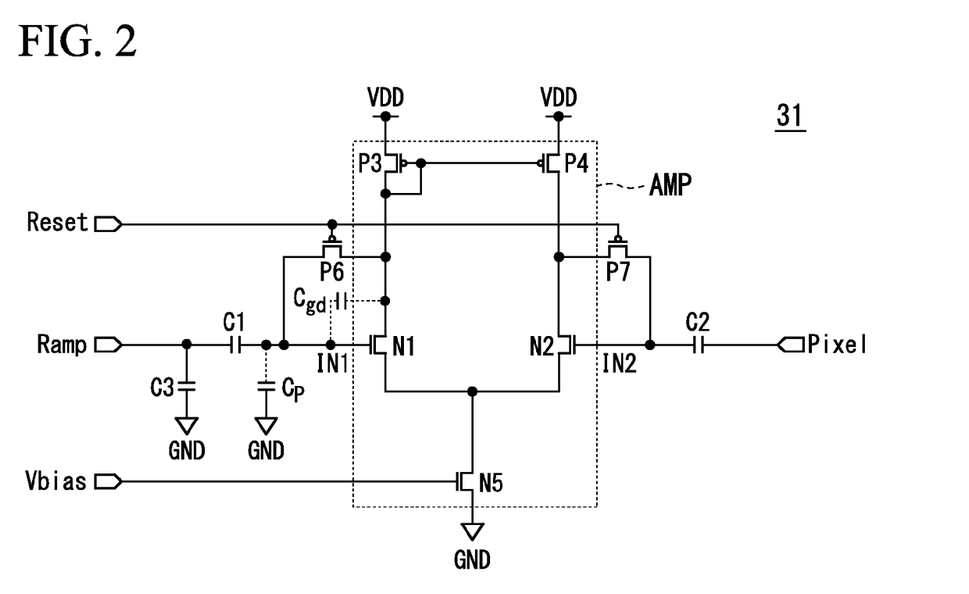
FIG. 2 is a circuit diagram illustrating a configuration of a comparison section included in the imaging device according to the embodiment of the present invention.

Next, a detailed configuration of the comparison section 31 will be described. FIG. 2 illustrates an exemplary configuration of the comparison section 31. The comparison section 31 includes the differential amplifier AMP, the transistors P6 and P7, and the capacitive elements C1, C2, and C3.

The differential amplifier AMP includes the transistors N1 and N2 composed of an NMOS to which a source is commonly connected, the transistors P3 and P4 composed of a PMOS that is connected between drains of the transistors N1 and N2 and power VDD and to which a gate is commonly connected, and the current source N5 of the NMOS that is connected between a node commonly connected to sources of the transistors N1 and N2 and the ground GND. In addition, the differential amplifier AMP includes the first input terminal IN1 (a gate of the transistor N1) electrically connected to the reference signal generating section 16 and the second input terminal IN2 (a gate of the transistor N2) electrically connected to the unit pixel 3, and compares voltages of the first input terminal IN1 and the second input terminal IN2.

The transistors P6 and P7 composed of a PMOS are connected between gates and drains of the transistors N1 and N2. The transistors P6 and P7 serve as a reset section configured to set an ON state when a reset pulse Reset of Low active is supplied from the timing control section 20 to each gate, connect gates and drains of the transistors N1 and N2, and reset voltages of gates of the transistors N1 and N2, that is, voltages of two input terminals of the differential amplifier AMP.

The first terminals of the capacitive elements C1 and C2 for cutting a DC level are connected to the gates of the transistors N1 and N2, respectively, that is, the first input terminal IN1 and the second input terminal IN2 of the differential amplifier AMP. The second terminal of the capacitive element C1 (second capacitive element) is electrically connected to the reference signal generating section 16, and is supplied with a reference signal Ramp from the reference signal generating section 16. The second terminal of the capacitive element C2 is electrically connected to the unit pixel 3 of the imaging section 2 and supplied with a pixel signal Pixel output from each of the unit pixels 3.

The first terminal of the capacitive element C3 (first capacitive element) is connected to the second terminal of the capacitive element C1. That is, the first terminal of the capacitive element C3 is electrically connected to the first input terminal IN1 of the differential amplifier AMP through the capacitive element C1. The second terminal of the capacitive element C3 is connected to the ground GND. In addition, a gate of the current source N5 is supplied with a bias voltage Vbias for controlling a current value.

In other words, the first terminal of the capacitive element C3 is electrically connected to the first input terminal IN1 through the capacitive element C1, and the second terminal of the capacitive element C3 is electrically connected to a predetermined voltage source (the ground GND). In addition, the first terminal of the capacitive element C1 is electrically connected to the first input terminal IN1, and the second terminal of the capacitive element C1 is electrically connected to the reference signal generating section 16 and the first terminal of the capacitive element C3.

In FIG. 2, by reversing a polarity of the transistor, the power VDD and the ground GND may be reversed. Therefore, the second terminal of the capacitive element C3 may be connected to the power VDD.

Within the configuration of the comparison section 31, the transistors P6 and P7 and the capacitive elements C1 and C2 are not an essential configuration in order to obtain characteristic effects of the imaging device 1 according to the present embodiment.

Next, operations of the comparison section 31 will be described. After the reset level is supplied to the second input terminal IN2 as a pixel signal Pixel from the unit pixel 3, and the reference signal Ramp supplied from the reference signal generating section 16 to the first input terminal IN1 is stabilized, the timing control section 20 activates (Low active) a reset pulse Reset before the comparison section 31 starts comparison. Accordingly, the transistors P6 and P7 are turned ON, gates and drains of the transistors N1 and N2 are connected, and voltages of the two input terminals are reset using an operation point of these transistors N1 and N2 as a drain voltage.

At the operation point determined by this reset, the voltages of the two input terminals of the differential amplifier AMP, that is, an offset component of each gate voltage of the transistors N1 and N2, is substantially canceled. That is, the voltages of the two input terminals of the differential amplifier AMP are reset to have substantially the same voltage. After resetting, the transistors P6 and P7 are turned OFF.

Next, a voltage of the reference signal Ramp supplied to the first input terminal IN1 is changed in a ramp shape. The comparison output of the comparison section 31 is inverted at a timing at which a voltage of the first input terminal IN1 to which the reference signal Ramp is supplied and a voltage of the second input terminal IN2 to which the reset level is supplied are substantially the same.

Since an operation when the signal level is supplied to the second input terminal IN2 as the pixel signal Pixel from the unit pixel 3 is the same as the above operation except that no reset is performed by the transistors P6 and P7, description thereof will not be repeated.

Feedthrough in the Prior Art and the Present Embodiment and Comparison Thereof

Hereinafter, feedthrough when the comparison output of the comparison section 31 is inverted, that is, an error factor transmitted from the comparison section 31 to the reference signal, will be described.

An overlap capacitance (capacitance value: $C_{gd}$) is provided between a gate terminal and a drain terminal of the transistor N1 constituting a differential pair, and an input capacity (capacitance value: $C_P$) is provided in the gate terminal of the transistor N1. In addition, a capacitance value of the capacitive element C1 is set as $C_{DAC}$, a capacitance value of the capacitive element C3 is set as $C_{LPF}$, the number of columns (the number of column AD converting sections 30) is set as n, and a resistance value of a current-to-voltage conversion resistor constituting the reference signal generating section 16 is set as $R_{DAC}$. Here, a relation of the following Formula (1) can be established among the capacitive element C1 (capacitance value: $C_{DAC}$), the capacitive element C3 (capacitance value: $C_{LPF}$), and the input capacity (capacitance value: $C_P$) of the gate terminal.

$$C_{DAC} > C_{LPF} > C_P \qquad (1)$$

When the comparison output of the comparison section 31 is inverted, a change in the drain voltage of the transistor N1 according to the inversion is transmitted (fed through) to the reference signal Ramp through the overlap capacitance (capacitance value: $C_{gd}$). A coefficient of feedthrough in the prior art without the capacitive element C3 depends on a ratio between capacitance values of the overlap capacitance (capacitance value: $C_{gd}$) and the input capacity (capacitance value: $C_P$) of the gate terminal. On the other hand, in the present embodiment with the capacitive element C3, a coefficient of feedthrough depends on a ratio between capacitance values of the overlap capacitance (capacitance value: $C_{gd}$) and a total capacity of the input capacity (capacitance value: $C_P$) of the gate terminal and the capacitive element C3 (capacitance value: $C_{LPF}$).

Figure 3:
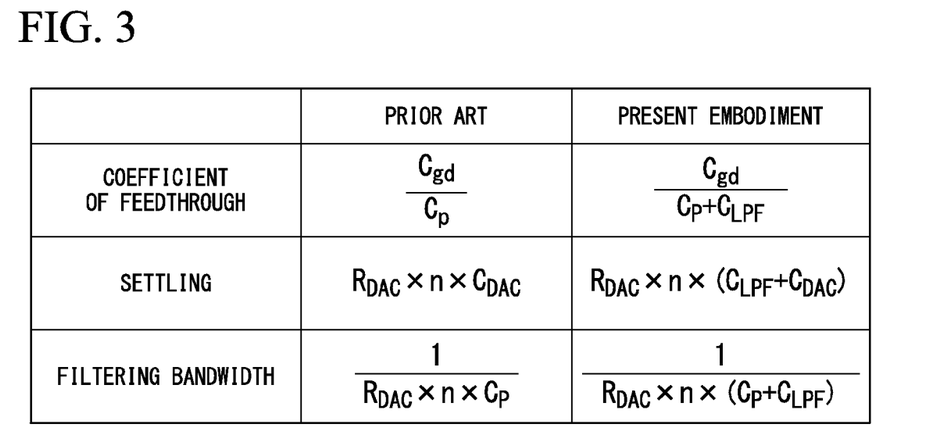
FIG. 3 is a reference diagram showing coefficients of feedthrough, settling, and filtering bandwidth according to the embodiment of the present invention and the prior art.

FIG. 3 shows coefficients of feedthrough, settling (settling time), and filtering bandwidth according to the prior art and the present embodiment. In the present embodiment, since the capacitance value $C_{LPF}$ of the capacitive element C3 is added to a denominator of the coefficient of feedthrough in the prior art, a value of the coefficient of feedthrough becomes smaller. That is, when the present embodiment is compared with the prior art, since error conveyed through the reference signal decreases, it is possible to suppress AD conversion error and image quality degradation. For example, when $R_{DAC}$: 50 [Ω], n: 5000 [column], $C_{DAC}$: 240 [fF], $C_{LPF}$: 60[fF], and $C_P$: 2[fF] ($C_{gs}$: ~×0.7 $C_P$, $C_{gd}$: ~×0.3 $C_P$) are set, the present embodiment can decrease a value of the coefficient of feedthrough to about 1/30 of that of the prior art. The $C_{gs}$ refers to an overlap capacitance between the gate terminal and a source terminal of the transistor N1.

When the capacitive element C3 is provided, there is concern of the settling becoming longer when the comparison section 31 is reset (balanced). However, when the capacitive element C3 is configured such that the capacitance value $C_{LPF}$ of the capacitive element C3 satisfies the conditions of Formula (1), it is possible to suppress the settling from increasing while maintaining the above effects.

As an effect associated with the capacitive element C3, a filtering bandwidth of the reference signal generating section 16 decreases. As a result, there is a possibility of decreasing noise.

When an influence on the settling is negligible, the capacitance value $C_{LPF}$ of the capacitive element C3 may be equal to or greater than the capacitance value $C_{DAC}$ of the capacitive element C1. That is, the imaging device 1 according to the present embodiment is not limited to the conditions of Formula (1).

According to the present embodiment there is provided the imaging device, including the imaging section 2 in which the plurality of unit pixels 3 having a photoelectric conversion element are arranged in the form of a matrix, the reference signal generating section 16 configured to generate the reference signal that increases or decreases with the passage of time, the comparison section 31 that includes the differential amplifier AMP including the first input terminal IN1 electrically connected to the reference signal generating section 16 and the second input terminal IN2 electrically connected to the unit pixel 3, and configured to compare voltages of the first input terminal IN1 and the second input terminal IN2, and is arranged for each column or for a plurality of columns of the pixel array of the imaging section 2, and the measurement section 32 configured to measure a comparison time from when the comparison section 31 starts comparison until the comparison ends and generate data corresponding to the comparison time, wherein the comparison section 31 includes the first capacitive element (the capacitive element C3), the first terminal of the first capacitive element is electrically connected to the first input terminal IN1, and the second terminal of the first capacitive element is electrically connected to a predetermined voltage source (the ground GND or predetermined power).

In the present embodiment, it is possible to decrease feedthrough without using the above-described methods I) and II). Therefore, it is possible to decrease error conveyed through the reference signal, and it is possible to suppress AD conversion error and image quality degradation without increasing a consumption current and noise.

In addition, as shown in Formula (1), when the capacitance value of the capacitive element C3 is set to be smaller than the capacitance value of the capacitive element C1, it is possible to suppress the settling time from increasing when reset is performed while maintaining the above effects.

In addition, when the predetermined voltage source to which the second terminal of the capacitive element C3 is connected is set as the ground GND or predetermined power, there is no need to prepare a separate voltage source.

While an embodiment of the present invention has been described above in detail with reference to the accompanying drawings, specific configurations are not limited to the above embodiment, but include design modifications without departing from the spirit and scope of the present invention.

The present invention is broadly applicable to imaging devices and provides the imaging device using the ramp type AD converter capable of decreasing error conveyed through the reference signal and suppressing AD conversion error and image quality degradation without increasing a consumption current and noise.

What is claimed is:

1. An imaging device comprising:
an imaging section in which a plurality of unit pixels having a photoelectric conversion element are arranged in the form of a matrix;
a reference signal generating section configured to generate a reference signal that increases or decreases with a passage of time;
a comparison section that includes a differential amplifier including a first input terminal electrically connected to the reference signal generating section and a second input terminal electrically connected to the unit pixels and configured to compare voltages of the first input terminal and the second input terminal and is arranged for each column or for a plurality of columns of a pixel array of the imaging section; and
a measurement section configured to measure a comparison time from when the comparison section starts comparison until the comparison ends and generate data corresponding to the comparison time, wherein
the comparison section includes a first capacitive element and a second capacitive element,
a first terminal of the first capacitive element is electrically connected to a second terminal of the second capacitive element and the reference signal generating section,
a second terminal of the first capacitive element is directly electrically connected to a predetermined voltage source, and
a first terminal of the second capacitive element is electrically connected to the first input terminal.

2. The imaging device according to claim 1, wherein the first capacitive element has a capacitance value that is smaller than a capacitance value of the second capacitive element.

3. The imaging device according to claim 2, wherein the predetermined voltage source is either power or a ground.

4. The imaging device according to claim 1, wherein the predetermined voltage source is either power or a ground.

5. An imaging device comprising:
an imaging section in which a plurality of unit pixels having a photoelectric conversion element are arranged in the form of a matrix;
a reference signal generating section configured to generate a reference signal that increases or decreases with a passage of time;
a comparison section that includes a differential amplifier including a first input terminal electrically connected to the reference signal generating section and a second input terminal electrically connected to the unit pixels and configured to compare voltages of the first input terminal and the second input terminal and is arranged for each column or for a plurality of columns of a pixel array of the imaging section; and
a measurement section configured to measure a comparison time from when the comparison section starts comparison until the comparison ends and generate data corresponding to the comparison time, wherein
the comparison section includes a first capacitive element and a second capacitive element,
a first terminal of the first capacitive element is electrically connected to a second terminal of the second capacitive element and the reference signal generating section,
a second terminal of the first capacitive element is electrically connected to a predetermined voltage source, and
a first terminal of the second capacitive element is electrically connected to the first input terminal, wherein the first capacitive element has a capacitance value that is smaller than a capacitance value of the second capacitive element.

6. The imaging device according to claim 5, wherein the predetermined voltage source is either power or a ground.

* * * * *